(12) United States Patent  
Shirasaka et al.

(10) Patent No.: US 8,830,670 B2  
(45) Date of Patent: Sep. 9, 2014

(54) ELECTRONIC DEVICE HAVING MOUNTING STRUCTURE FOR HARD DISK DRIVE

(75) Inventors: Hideo Shirasaka, Hamura (JP); Tetsuhiko Fukazawa, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 13/216,854

(22) Filed: Aug. 24, 2011

(65) Prior Publication Data

US 2012/0134097 A1 May 31, 2012

(30) Foreign Application Priority Data

Nov. 29, 2010 (JP) ................................. 2010-264888

(51) Int. Cl.
- *H05K 7/00* (2006.01)
- *H05K 9/00* (2006.01)
- *G06F 1/16* (2006.01)

(52) U.S. Cl.
CPC ............ *H05K 9/0045* (2013.01); *G06F 1/1656* (2013.01)
USPC ............ 361/679.33; 361/679.34; 361/679.35; 361/679.36

(58) Field of Classification Search
USPC .............. 361/679.33, 679.34, 679.35, 679.36
See application file for complete search history.

(56) References Cited

U.S. PATENT DOCUMENTS

| | | | |
|---|---|---|---|
| 5,455,746 A | 10/1995 | Sato et al. | |
| 5,535,092 A * | 7/1996 | Bang | 361/679.34 |
| 6,078,498 A * | 6/2000 | Eckerd et al. | 361/679.31 |
| 6,780,030 B2 | 8/2004 | Yoshinaga et al. | |
| 6,862,176 B1 * | 3/2005 | Codilian et al. | 361/679.33 |
| 6,914,777 B2 | 7/2005 | Hsu | |
| 7,310,223 B2 * | 12/2007 | Xu et al. | 361/679.33 |
| 7,458,511 B2 | 12/2008 | Takimoto | |
| 7,499,282 B1 | 3/2009 | Loucks | |
| 7,643,243 B2 * | 1/2010 | Lee et al. | 360/97.19 |
| 7,768,774 B2 * | 8/2010 | Tsuchida | 361/679.21 |
| 2002/0043608 A1 * | 4/2002 | Nakata et al. | 248/560 |
| 2004/0100761 A1 | 5/2004 | Liu | |
| 2005/0213249 A1 | 9/2005 | Shimomura | |
| 2005/0243507 A1 | 11/2005 | Lambert et al. | |
| 2006/0002061 A1 | 1/2006 | Hua | |
| 2006/0002065 A1 | 1/2006 | Hua | |
| 2006/0002077 A1 | 1/2006 | Carlson et al. | |

(Continued)

FOREIGN PATENT DOCUMENTS

| | | |
|---|---|---|
| JP | H01-150293 | 6/1989 |
| JP | H06-075661 | 3/1994 |

(Continued)

OTHER PUBLICATIONS

Office Action, mailed Feb. 14, 2012, in priority Japanese Application No. JP 2010-264888.

(Continued)

*Primary Examiner* — Hung S Bui  
*Assistant Examiner* — James Wu  
(74) *Attorney, Agent, or Firm* — Knobbe, Martens, Olson & Bear, LLP

(57) ABSTRACT

According to one embodiment, an electronic device is provided with a casing including a module receiving portion which receives a module and includes a module supporting wall and a module surrounding wall. The module supporting wall includes a module support portion, and an opening provided between the support portion and the module surrounding wall.

8 Claims, 15 Drawing Sheets

(56) References Cited

U.S. PATENT DOCUMENTS

| | | |
|---|---|---|
| 2006/0098396 A1 | 5/2006 | Shih |
| 2006/0134940 A1 | 6/2006 | Motoe |
| 2006/0258289 A1 | 11/2006 | Dua |
| 2007/0008691 A1 | 1/2007 | Kim |
| 2007/0146988 A1 | 6/2007 | Yamagishi et al. |
| 2008/0137281 A1 | 6/2008 | Chen et al. |
| 2008/0225494 A1 | 9/2008 | Yang |
| 2009/0009939 A1 | 1/2009 | Nakajima et al. |
| 2010/0073861 A1* | 3/2010 | Takeguchi et al. ....... 361/679.33 |
| 2011/0107359 A1* | 5/2011 | Lee et al. ...................... 720/600 |

FOREIGN PATENT DOCUMENTS

| | | | |
|---|---|---|---|
| JP | 3023337 U | 4/1996 | |
| JP | H08-097575 | 4/1996 | |
| JP | H09-050689 | 2/1997 | |
| JP | 09139060 A * | 5/1997 | ............ G11B 33/02 |
| JP | H09-139060 | 5/1997 | |
| JP | 09266388 A * | 10/1997 | ............... H05K 7/04 |
| JP | H09-266388 | 10/1997 | |
| JP | 11030207 A * | 2/1999 | ............... F16B 5/02 |
| JP | H11-030207 | 2/1999 | |
| JP | 2000-039934 | 2/2000 | |
| JP | 2000-277935 | 10/2000 | |
| JP | 2001-092564 | 4/2001 | |
| JP | 2002-358140 | 12/2002 | |
| JP | 2003-346755 | 12/2003 | |
| JP | 2004055988 | 2/2004 | |
| JP | 2005284335 | 10/2005 | |
| JP | 2006-107341 | 4/2006 | |
| JP | 2006-172371 | 6/2006 | |
| JP | 2007-323403 | 12/2007 | |
| JP | 2009-151525 | 7/2009 | |

OTHER PUBLICATIONS

Office Action, mailed Apr. 9, 2013, in Japanese Application No. JP 2012-151621, which is a division of priority Japanese Application No. JP 2010-264888.

Explanation of Non-English Language Reference(s).

Notice of Allowance for the Japanese Patent Application No. 2008-243201 mailed by Japan Patent Office on Sep. 15, 2009.

Office Action in Japanese Applicatin No. 2012-151621 which is a division of Priority JP Application No. JP 2010-264888 mailed Jan. 7, 2014, 4 pgs.

* cited by examiner

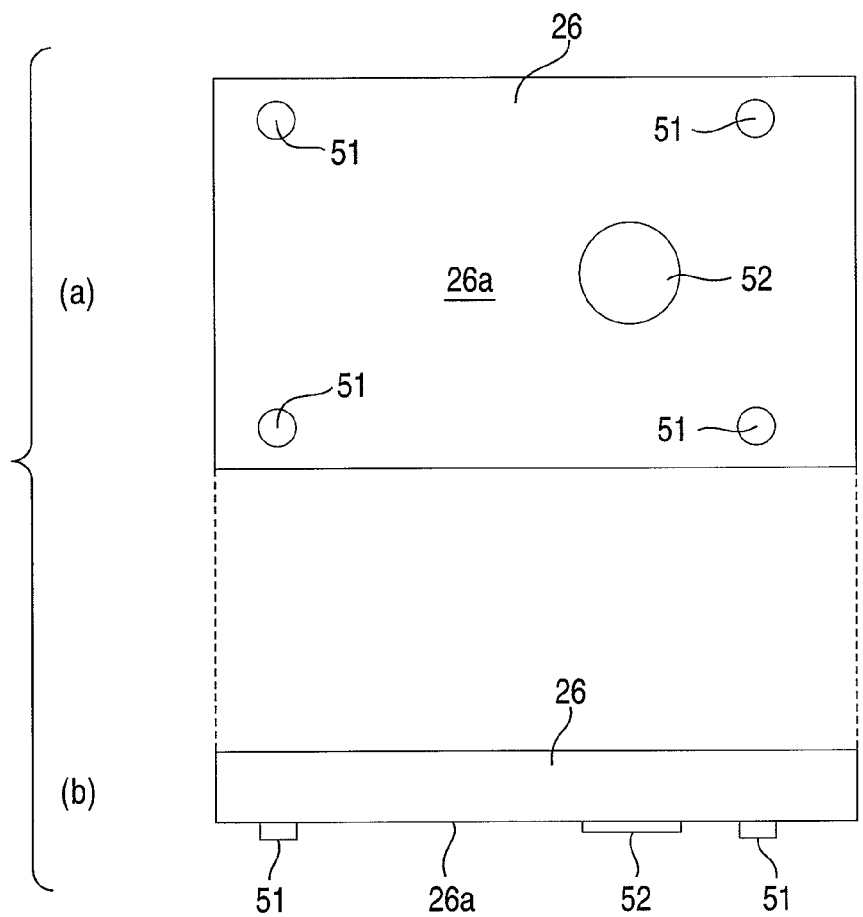
F I G. 7
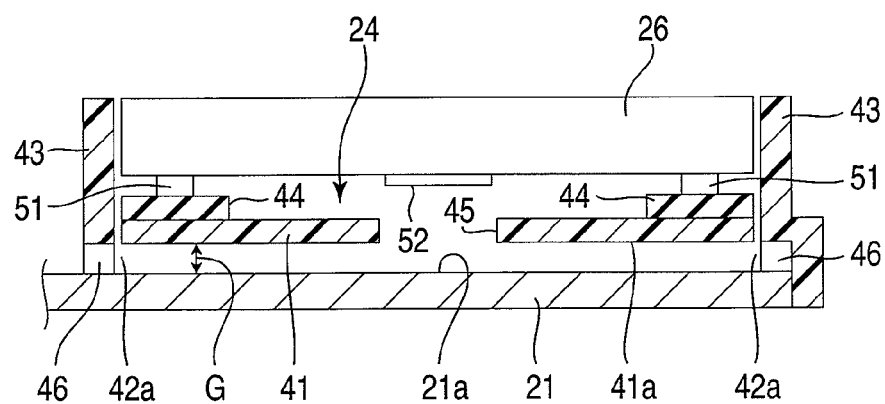
F I G. 8

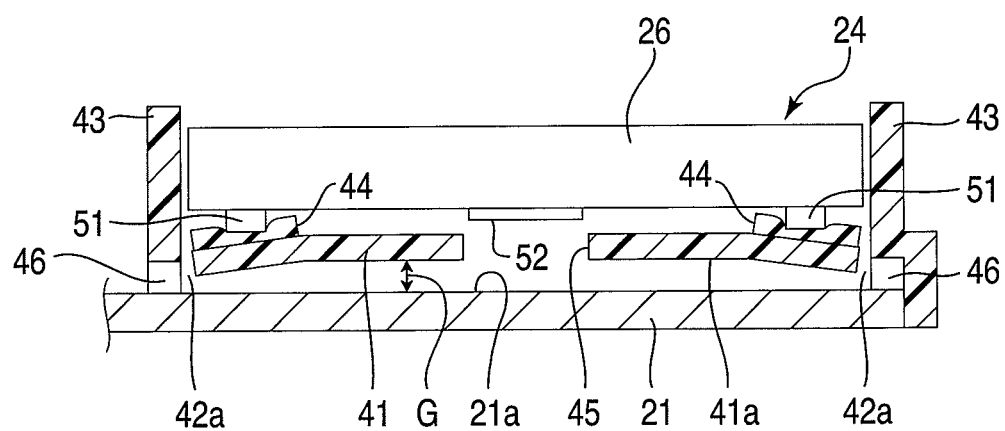
F I G. 10

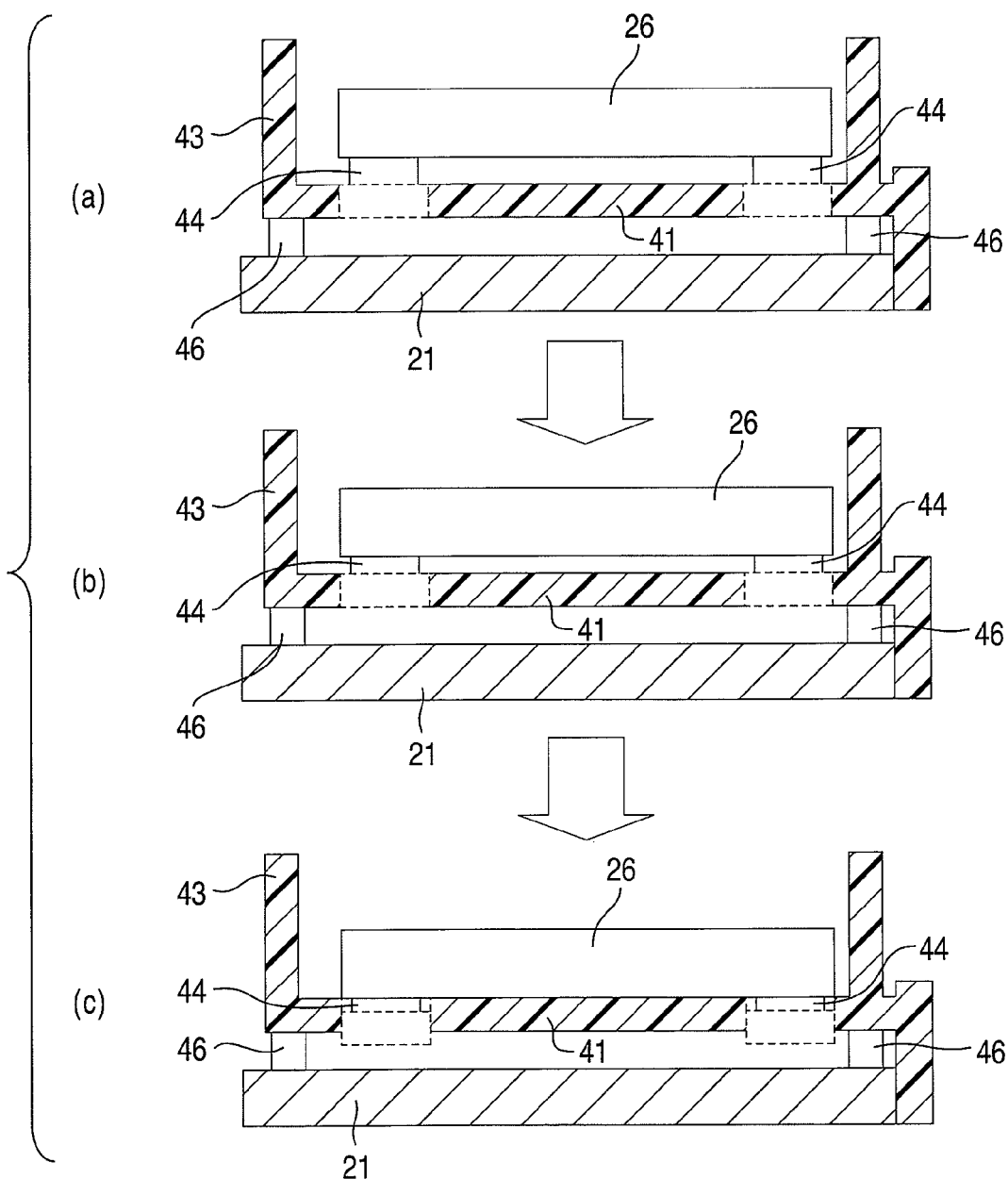
F I G. 11

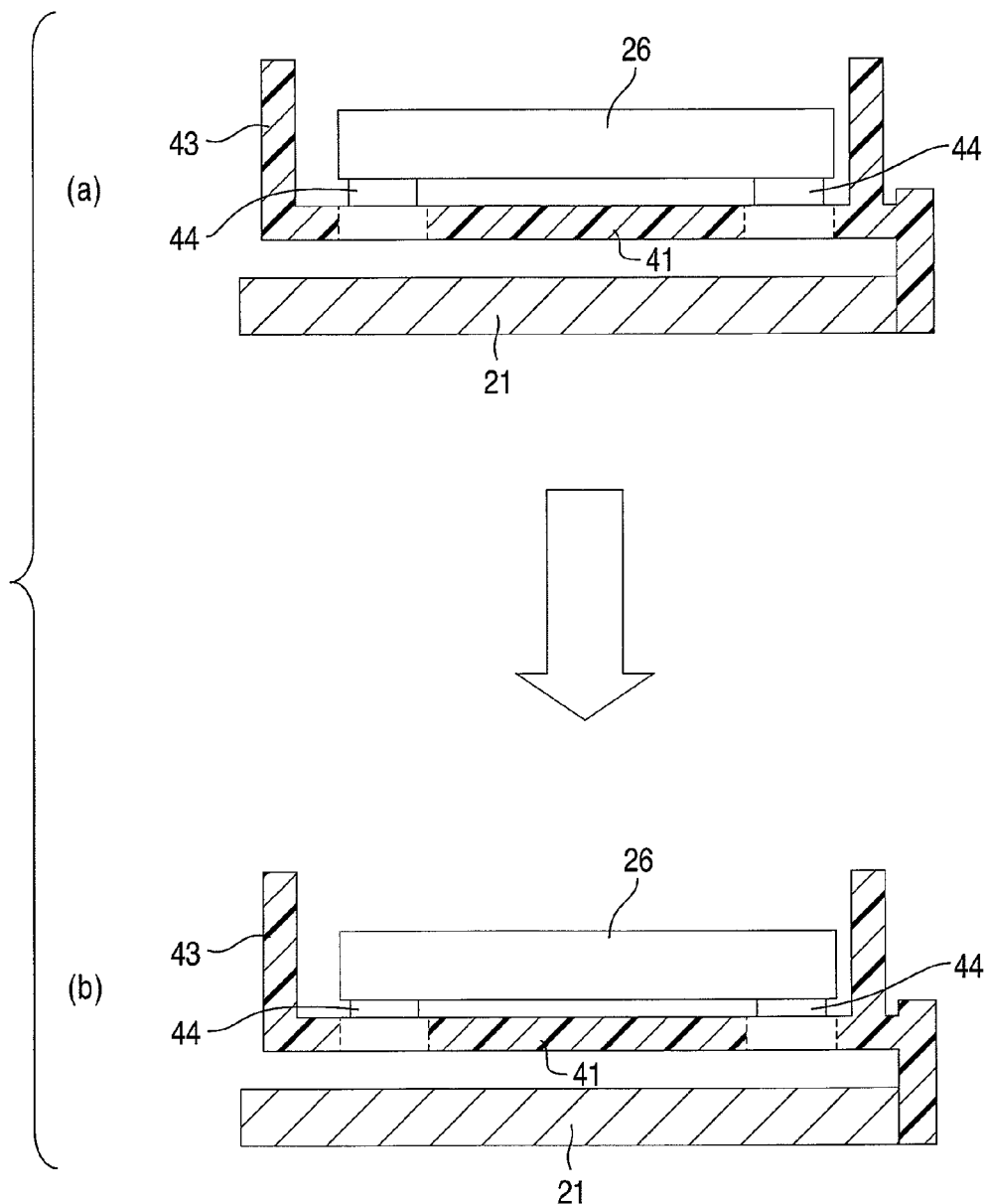
F I G. 12

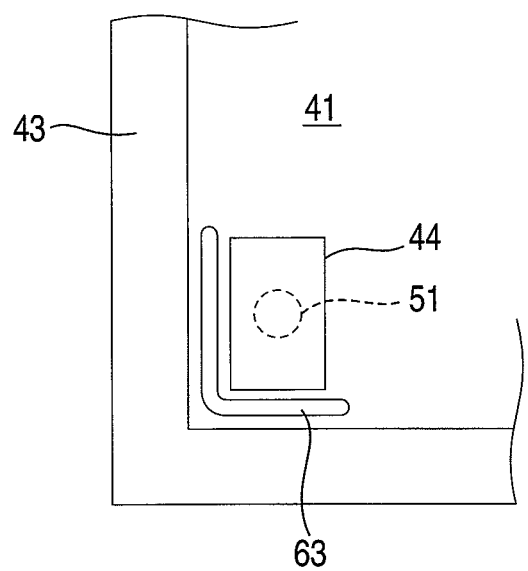
F I G. 15
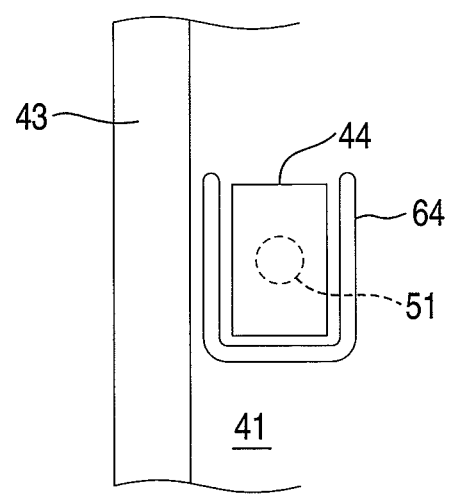
F I G. 16

ELECTRONIC DEVICE HAVING MOUNTING STRUCTURE FOR HARD DISK DRIVE

CROSS-REFERENCE TO RELATED APPLICATIONS

This application is based upon and claims the benefit of priority from Japanese Patent Application No. 2010-264888, filed Nov. 29, 2010; the entire contents of which are incorporated herein by reference.

FIELD

Embodiments described herein relate generally to an electronic device with a hard disk drive, such as a portable computer.

BACKGROUND

Notebook-type portable computers (hereinafter, "the note PCs"), for example, may well fall when they are carried. When a note PC has fallen, its hard disk drive (HDD) is most liable to be damaged, and may become inoperable at the worst.

Accordingly, when an HDD is installed in a note PC, a buffer member is interposed between the casing of the PC and the HDD to prevent the external impact exerted on the PC from being directly transferred to the HDD.

However, the conventional countermeasure using the buffer member is insufficient to absorb the impact on the HDD.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

Figure 3:
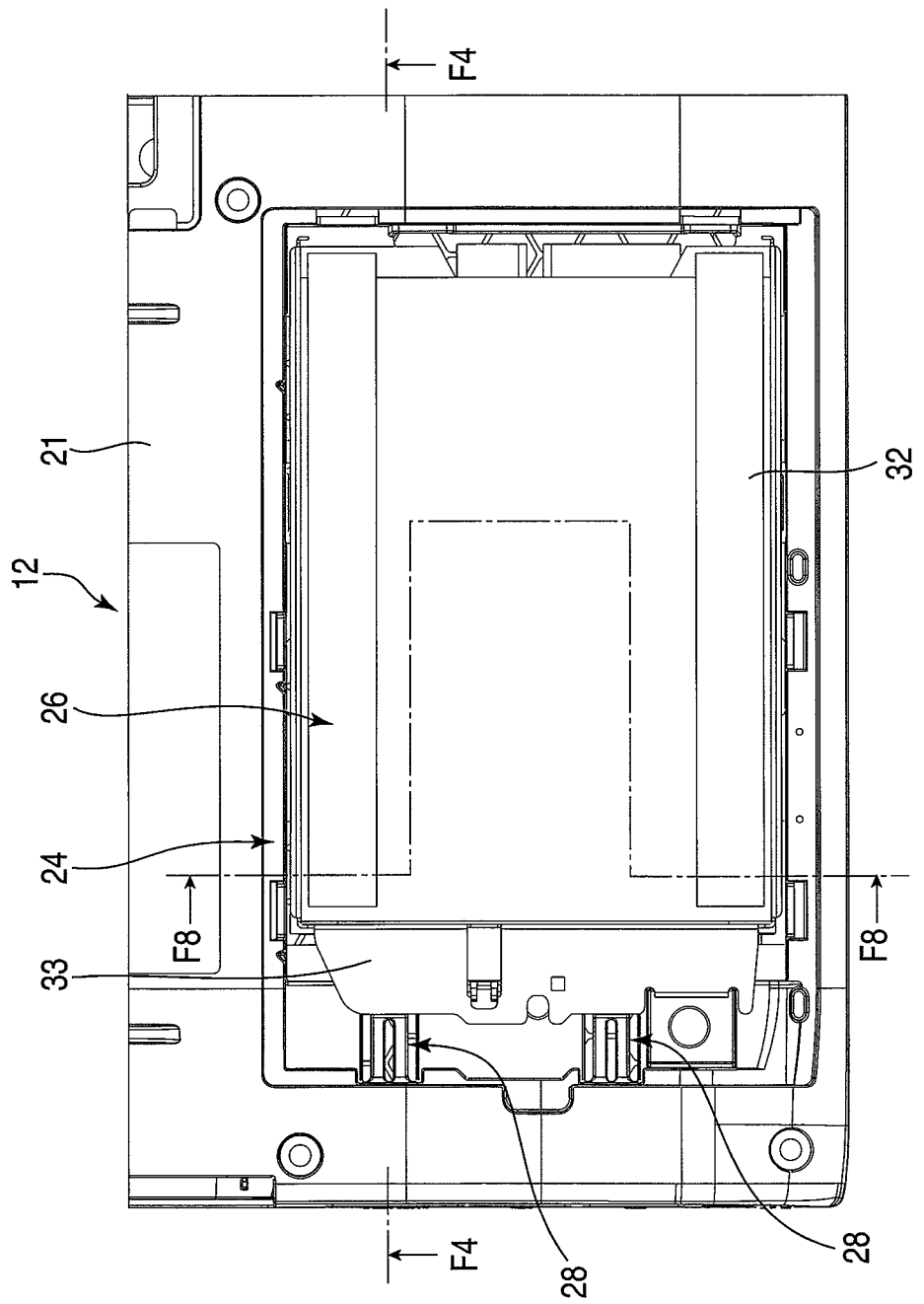
FIG. 3 is a bottom view illustrating a state in which a cover is detached from the reverse surface of the main unit of FIG. 2.
Figure 4:
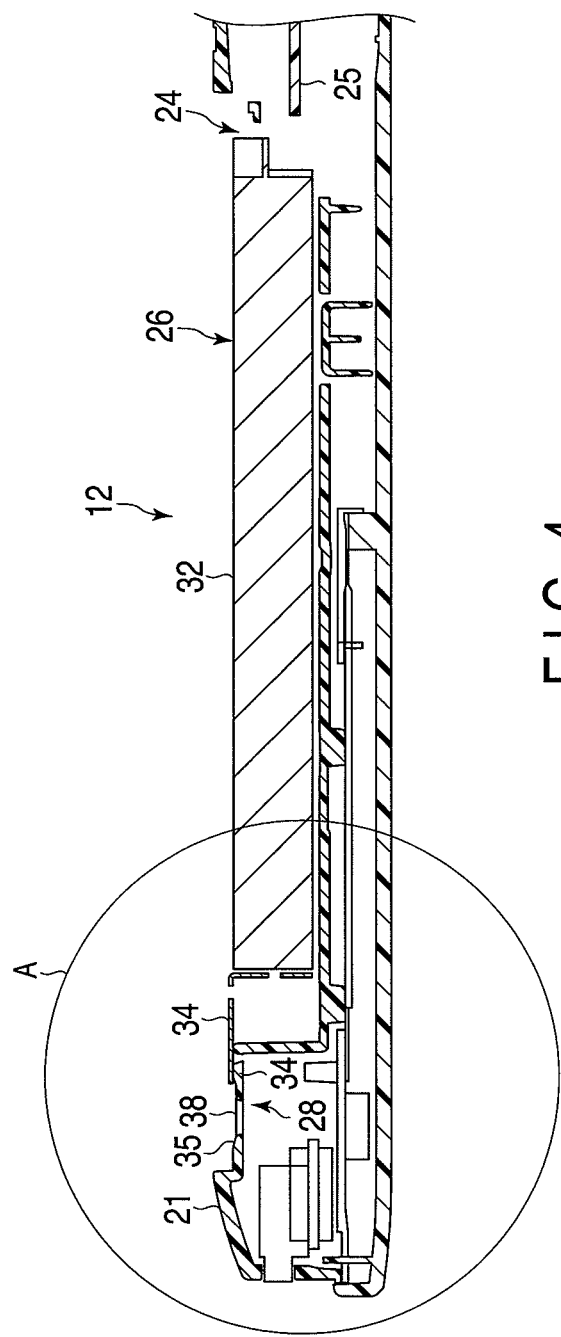
FIG. 4 is a sectional view taken along line F4-F4 of FIG. 3.
Figure 6:
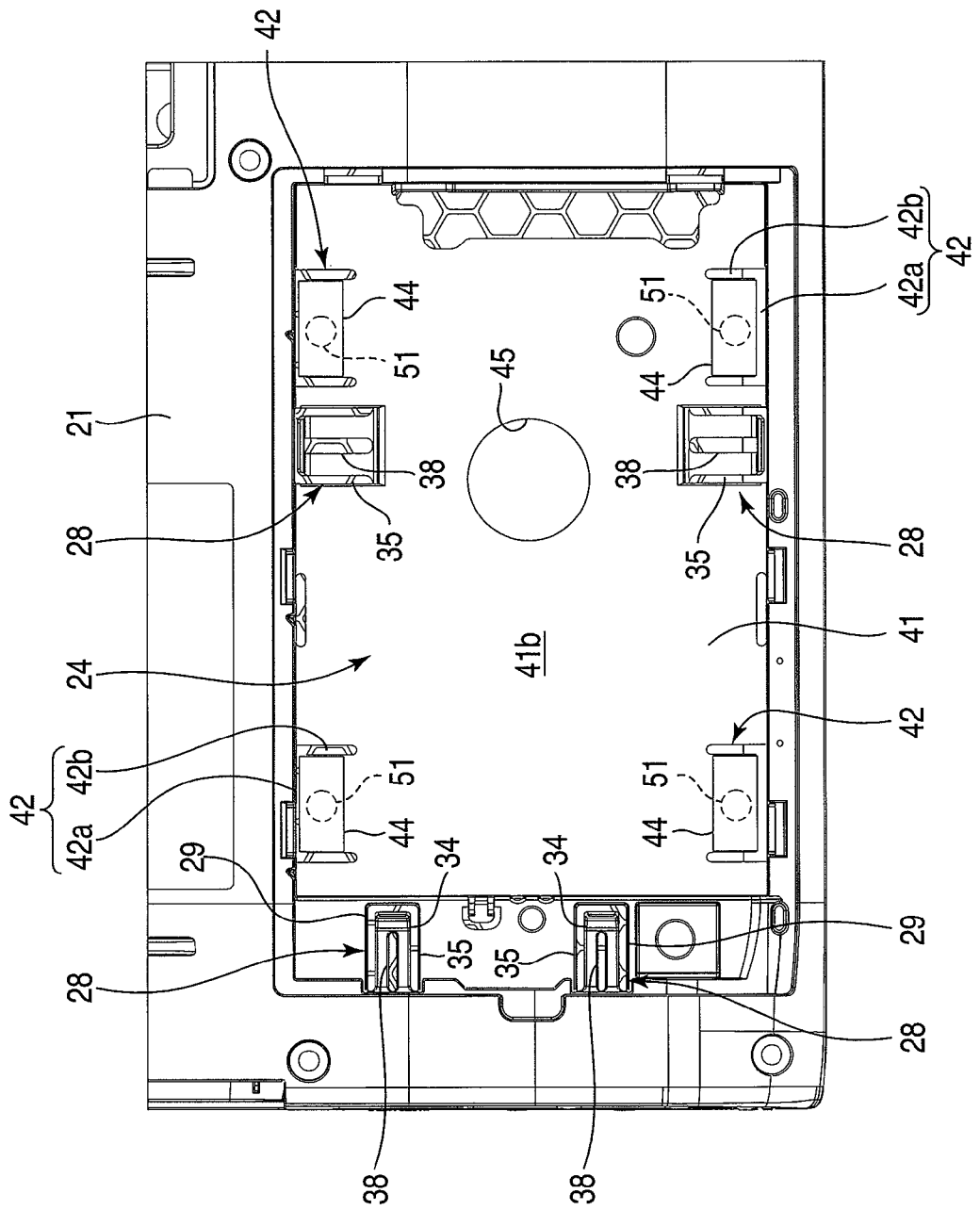
FIG. 6 is a bottom view illustrating a state in which an HDD is detached from the main unit of FIG. 3.
Figure 9:
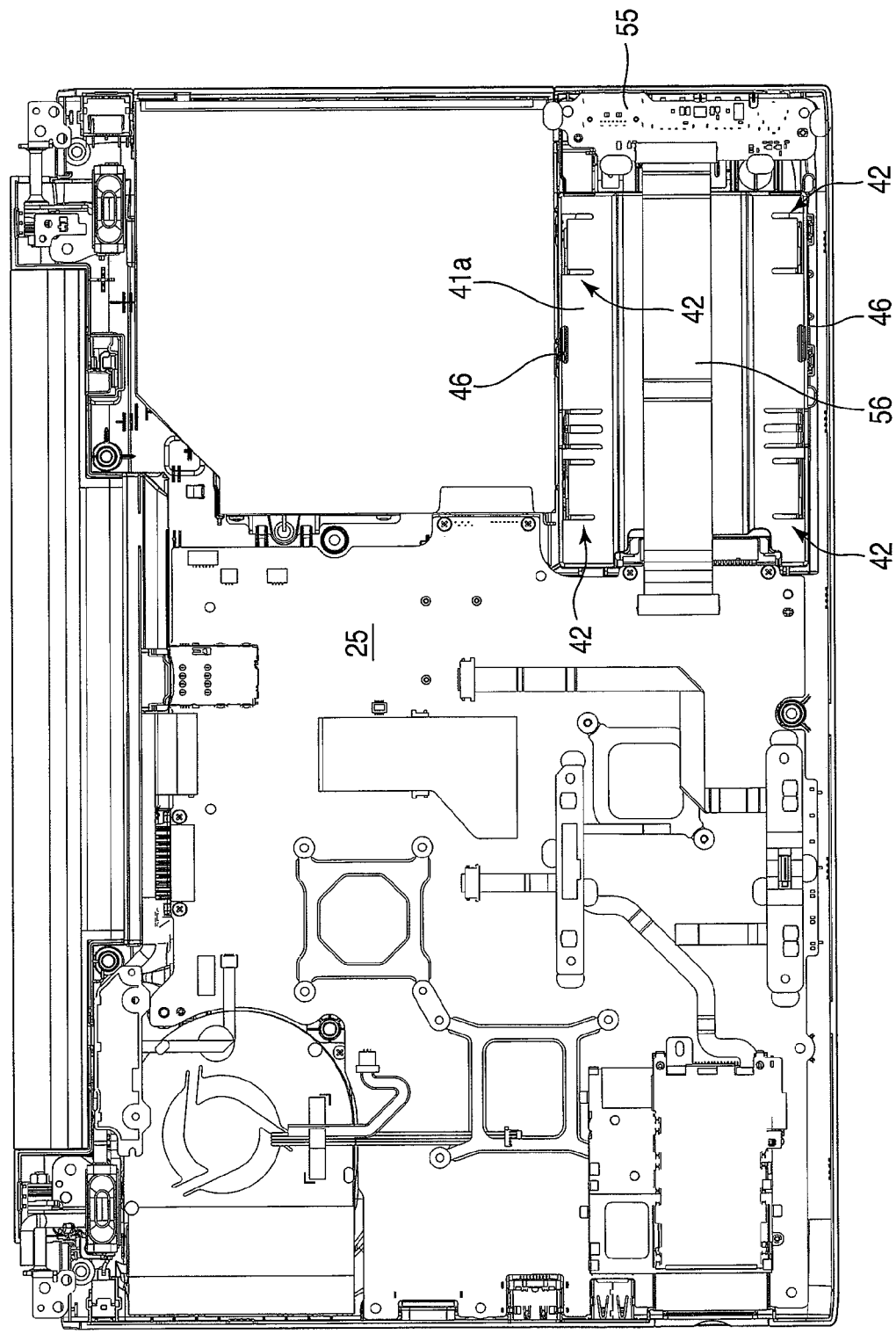
Figure 13:
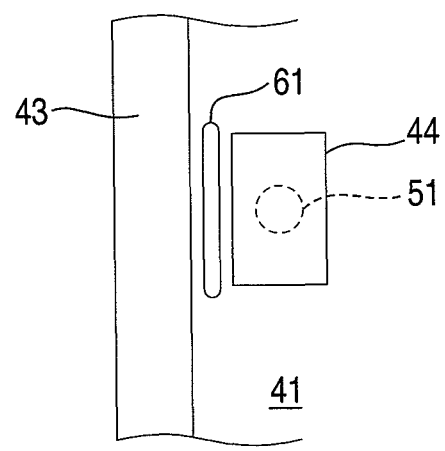
Figure 14:
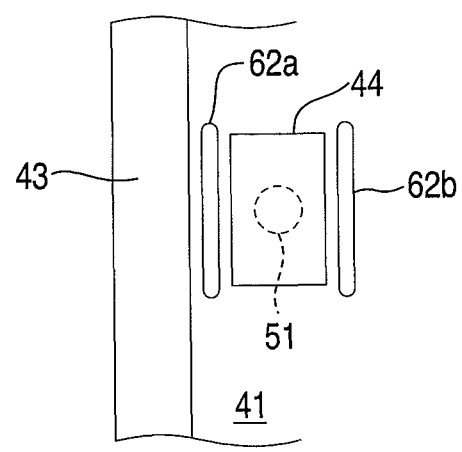
Figure 17:
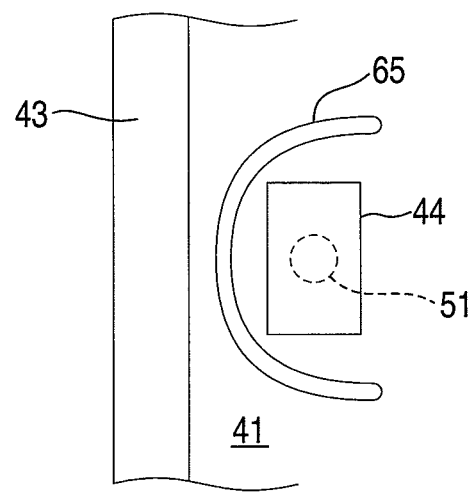
Figure 18:
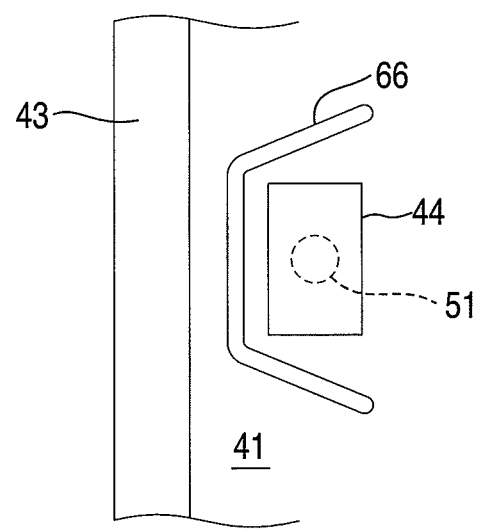
Figure 19:
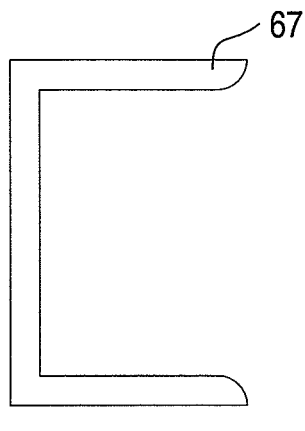
Figure 21:
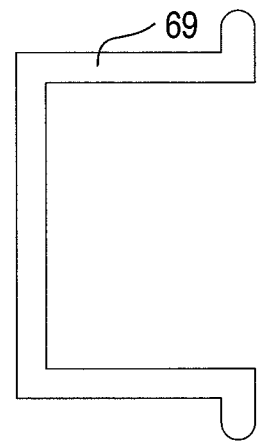
Figure 20:
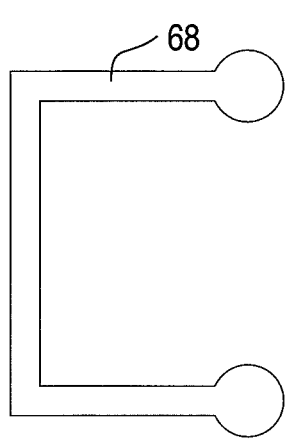
Figure 22:
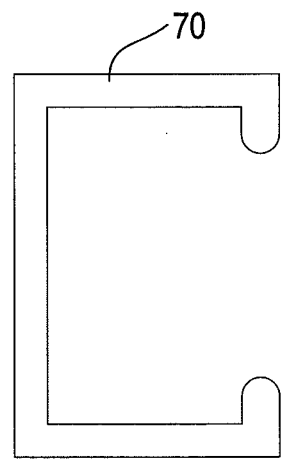

(a) of FIG. 7 is a bottom view of the HDD to be received in a recess formed in the main unit of FIG. 3;

(b) of FIG. 7 is a side view of the HDD;

FIG. 8 is a schematic sectional view taken along line F8-F8 of FIG. 3;

FIG. 9 is a plan view illustrating a state in which a main body cabinet is removed from the upper surface of the main unit of FIG. 3;

FIG. 10 is a schematic sectional view corresponding to FIG. 3 and illustrating an actually deformed state of a buffer structure assumed when impact is externally applied to the main unit of FIG. 3;

FIG. 11 is a schematic sectional view useful in explaining the behavior of the buffer structure assumed when impact is externally applied to the main unit of FIG. 3;

FIG. 12 is a schematic sectional view useful in explaining the behavior of a conventional buffer structure compared to FIG. 11;

FIG. 13 is a partially enlarged plan view illustrating a linear slit formed in a buffer structure according to a second embodiment;

FIG. 14 is a partially enlarged plan view illustrating two slits formed in a buffer structure according to a third embodiment;

FIG. 15 is a partially enlarged plan view illustrating an L-shaped slit formed in a buffer structure according to a fourth embodiment;

FIG. 16 is a partially enlarged plan view illustrating a U-shaped slit formed in a buffer structure according to a fifth embodiment;

FIG. 17 is a partially enlarged plan view illustrating an arcuate slit formed in a buffer structure according to a sixth embodiment;

FIG. 18 is a partially enlarged plan view illustrating a slit of a substantially trapezoidal shape formed in a buffer structure according to a seventh embodiment;

FIG. 19 is a schematic view illustrating a first modification of the slit of the first embodiment shown in FIG. 6;

FIG. 20 is a schematic view illustrating a second modification of the slit of the first embodiment shown in FIG. 6;

FIG. 21 is a schematic view illustrating a third modification of the slit of the first embodiment shown in FIG. 6; and FIG. 22 is a schematic view illustrating a fourth modification of the slit of the first embodiment shown in FIG. 6.

DETAILED DESCRIPTION

In general, according to one embodiment, the casing of an electronic device has a module receiving portion that comprises a module supporting wall and a module surrounding wall. The module supporting wall includes an opening defined between a module supporting portion and the module surrounding wall.

Various embodiments will be described hereinafter with reference to the accompanying drawings.

Figure 1:
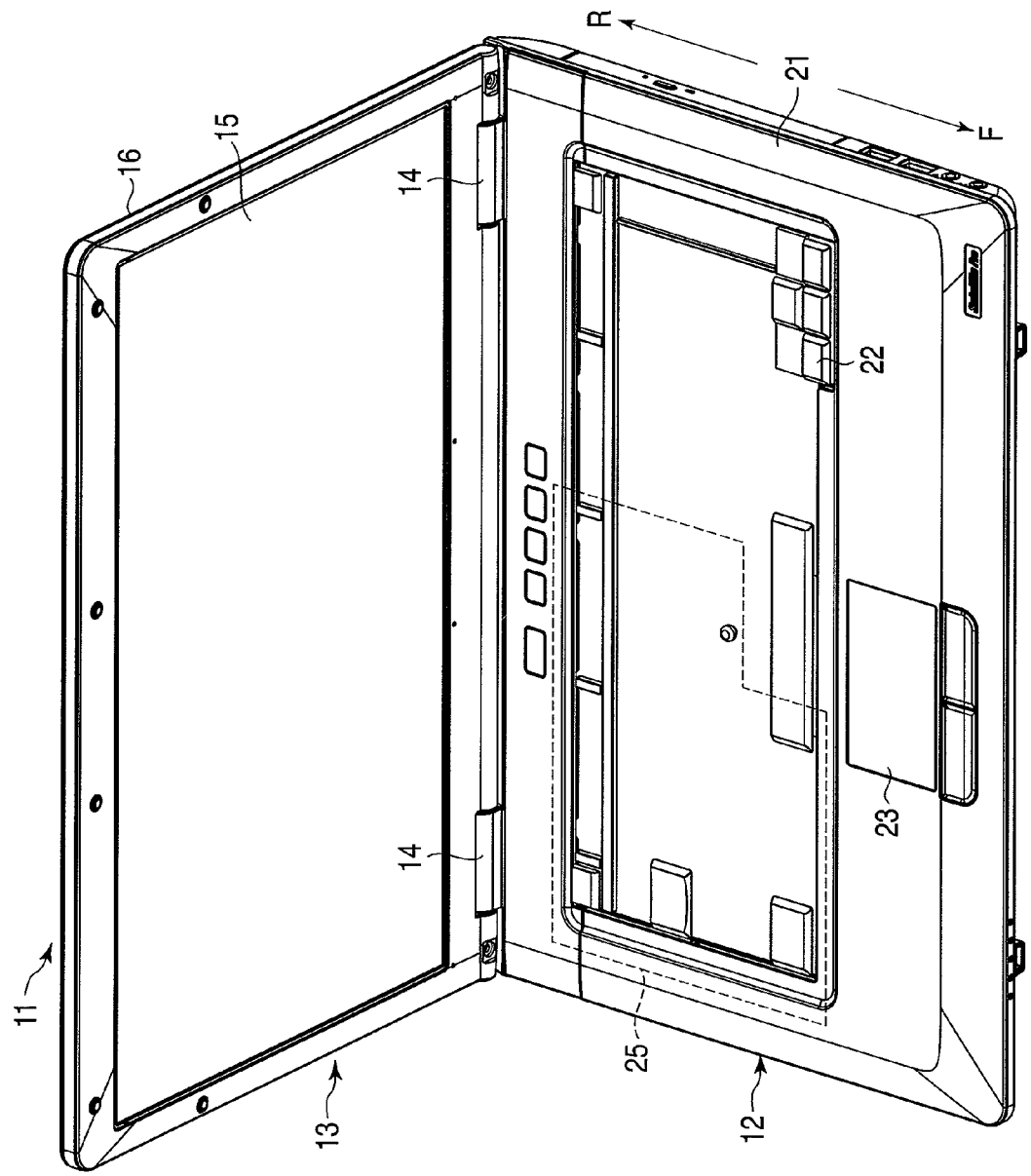
FIG. 1 is a perspective view illustrating a note PC according to embodiments.
Figure 2:
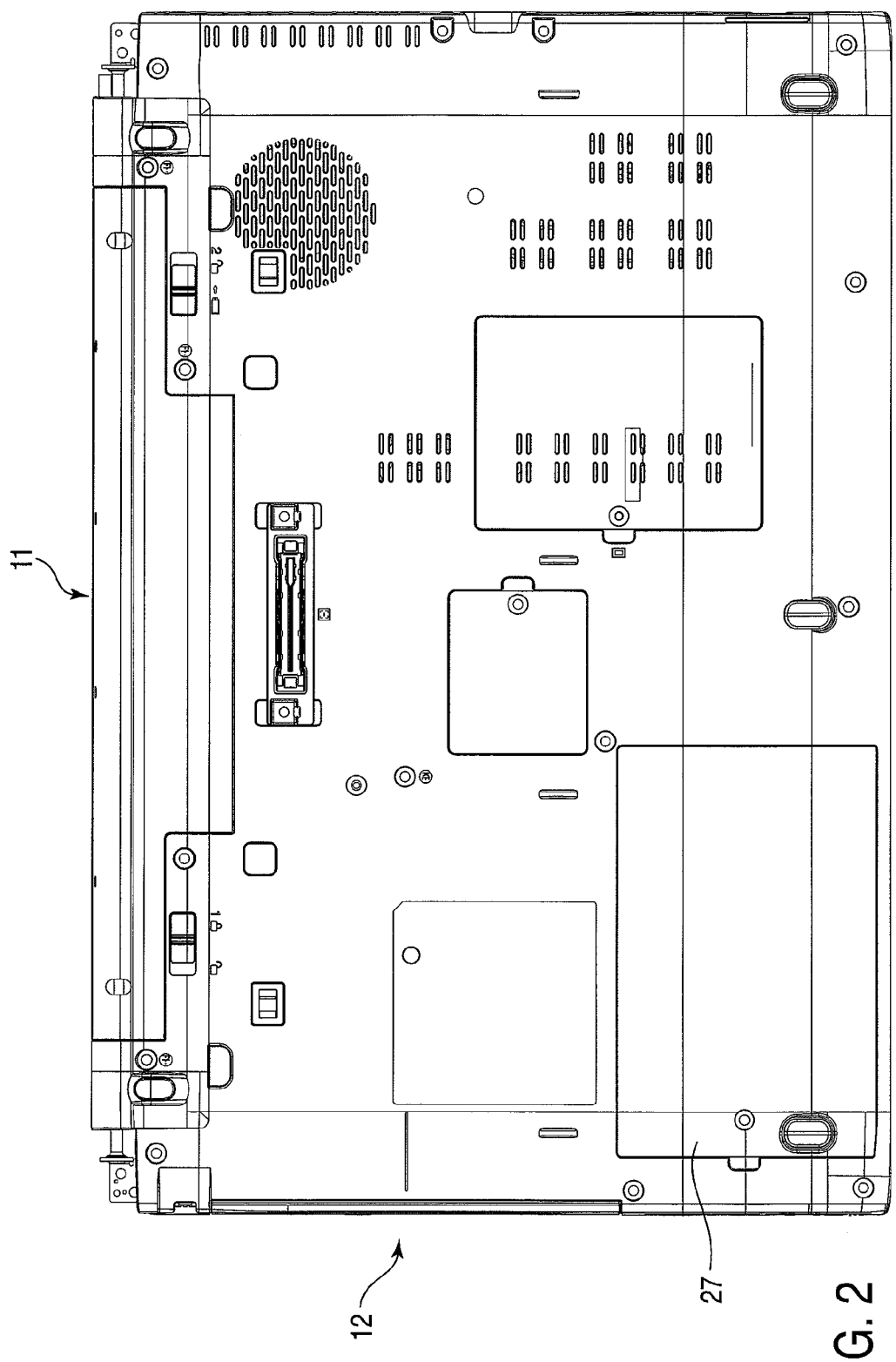
FIG. 2 is a bottom view illustrating the main unit of the note PC of FIG. 1 viewed from the reverse side.

Referring to FIGS. 1 to 12, electronic devices according to the embodiments will be described. In FIG. 1, the front side (user side) is denoted by symbol F, the rear side away from the user is denoted by symbol R.

As shown in FIG. 1, a note PC 11 as an example of an electronic device comprises a main unit 12, a display unit 13, and hinges 14 interposed between the main unit 12 and the display unit 13. The hinges 14 are rotatably attached to the rear ends of the main unit 12 and the display unit 13.

The display unit 13 comprises a display 15, and a display cabinet 16 surrounding the display 15 and made of a synthetic resin. In the embodiments, a liquid crystal display is installed as an example of the display 15 in the display unit 13.

The note PC 11 can assume such an open position as shown in FIG. 1, in which the display unit 13 stands with respect to the main unit 12 to open the display 15, and can also assume a closed position (not shown) in which the display unit 13 is closed to superpose the display 15 on the main unit 12.

As shown in FIGS. 1 to 4, the main unit 12 comprises a rectangular main unit cabinet 21 (casing) made of a synthetic resin, a keyboard 22 and a touch pad 23 attached to the upper surface of the main unit cabinet 21, a recess 24 (module receiving section) formed like a bathtub in the bottom of the main unit cabinet 21, a printed circuit board 25 housed in the main unit cabinet 21, a hard disk drive (HDD) 26 (module) received in the recess 24, a cover 27 (cover member) (see FIG. 2) having at least part thereof opposed to a surface (first surface) of the HDD 26 to cover the recess 24, and connection sections 28 formed integral with the main unit cabinet 21.

Figure 5:
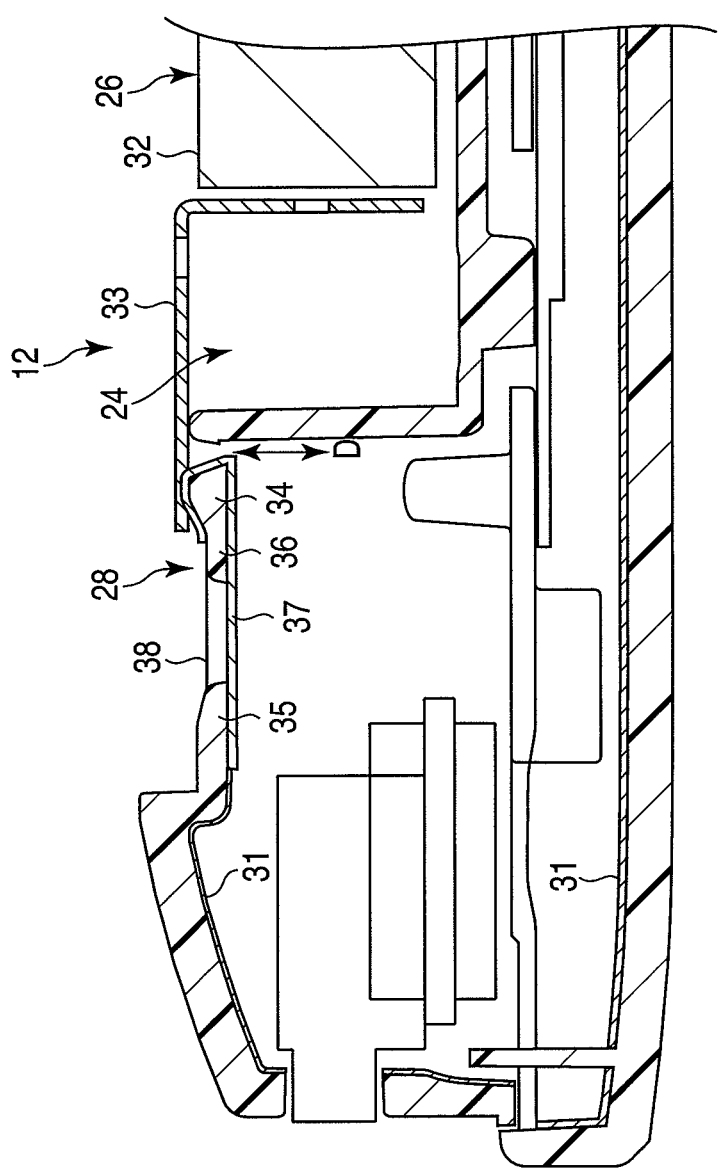
FIG. 5 is an enlarged sectional view illustrating the portion indicated by symbol A in FIG. 4.

As shown in FIG. 5, the main unit cabinet 21 has its inner surface covered with a shield layer 31 as a metal thin film formed by, for example, sputtering. The shield layer 31 prevents electromagnetic waves generated by, for example, the circuit components in the cabinet 21 from leaking through the cabinet 21 to the outside, or prevents external electromagnetic waves from adversely affecting the circuit components in the cabinet 21.

The HDD 26 is received in the recess 24, but is substantially fixed to the outer surface of the main unit cabinet 21. When the HDD 26 is received in the recess 24, it is electrically connected to the printed circuit board 25 in the main unit cabinet 21. The printed circuit board 25 includes circuit components such as a CPU. The recess 24 is covered with the cover 27.

As shown in FIGS. 3 to 6, the HDD 26 can be fitted into the recess 24 of the main unit cabinet 21 from below, and be detached therefrom. The HDD 26 comprises a box-shaped case 32 formed by bending a metal plate, an HDD unit received in the case 32, and attachment fittings 33 attached to the outside of the case 32. The case 32 serves as the envelope of the HDD 26.

The connection sections 28 are formed integral with the main unit cabinet 21 to project like arms through openings 29 formed in the main unit cabinet 21. The connection sections 28 are electrically connected to the shield layer 31 through the openings 29. The connection sections 28 are level with the main unit cabinet 21. The connection sections 28 have an electrical conducting property, and are brought into elastic contact with the case 32 of the HDD 26 to make the electrical potential of the case 32 and attachment fittings 33 equal to that of the shield layer 31.

The connection sections 28 each comprise a contact portion 34 to be brought into contact with the case 32 of the HDD 26, and a support portion 35 serving as a cantilever that elastically supports the contact portion 34. The contact portion 34 is the distal end of the connection section 28.

The contact portion 34 projects toward the case 32 so that it is positioned closer to the case 32 than the support portion 35. As shown in FIG. 5, the support portion 35 supports the contact portion 34 so that the contact portion 34 can move in a direction D that is substantially perpendicular to the contact surface of the case 32. Each of the connection sections 28 further comprises a main body portion 36 of a synthetic resin, a conductive cover layer 37 covering the periphery of the main body portion 36 and a through hole 38 formed through the main body portion 36 along the thickness thereof. As shown in FIG. 6, the through hole 38 is a long hole extending along the length of the connection section 28.

In this embodiment, the cover layer 37 is an aluminum sheet member, and is used to connect the case 32 of the HDD 26 to the shield layer 31 of the main unit cabinet 21.

In the above structure, since the case 32 of the HDD 26 can be connected to the shield layer 31 of the main unit cabinet 21 by the connection sections 28 provided on parts of the main unit cabinet 21, no particular conductive member is needed, which reduces the number of required components and hence reduces the manufacturing cost.

Further, the support portion 35 supports one end of the contact portion 34 so that the contact portion 34 can move in the direction D that is substantially perpendicular to the contact surface of the case 32. Thus, the contact portion 34 can be brought into elastic contact with the conductive case 32 by a simple structure.

Further, each of the connection sections 28 comprises the main body portion 36 of a synthetic resin, and the conductive cover layer 37 covering the periphery of the main body portion 36. This structure enables the connection sections 28 to be conductive and elastic. The support portion 35 has the through hole 38 extending therethrough along the thickness thereof. This structure enables the connection sections 28 to be further elastic.

Although in the embodiment, the support portion 35 supports only one end of the contact portion 34, the invention is not limited to this. Alternatively, the support portion 35 may support both ends of the contact portion 34.

A description will now be given of a buffer structure 40 for receiving the HDD 26 in the recess 24 in a buffered manner.

Firstly, referring to (a) and (b) of FIG. 7, the appearance of the HDD 26 will be described briefly. The HDD 26 has an appearance of a thin, substantially rectangular block shape. The reverse surface 26a (second surface) of the HDD 26, which opposes the bottom 41 of the recess 24, has a plurality (four in this embodiment) of substantially cylindrical leg portions 51 (first projections, contact portions), and a cylindrical motor housing 52 (second projection).

The motor housing 52 is provided at a position corresponding to the motor (not shown) of the HDD 26. The four leg portions 51 are provided near the corners of the rectangular reverse surface 26a. The height of the leg portions 51 from the reverse surface 26a is greater than that of the motor housing 52.

Further, as shown in FIG. 6, four U-shaped slits 42 (openings) according to the first embodiment, which serve as parts of the buffer structure 40, are formed through the bottom 41 of the recess 24 that are formed like a bathtub to receive the HDD 26.

The four U-shaped slits 42 are formed to surround the respective four leg portions 51 of the HDD 26. In FIG. 6, the positions (support portions) of the leg portions 51 corresponding to the slits 42 are indicated by the broken lines. Since the recess 24, i.e., the bottom 41, is formed of a plastic material, the portions of the bottom 41 surrounded by the U-shaped slits 42 are deformable like a spring.

More specifically, the U-shaped slits 42 of the bottom 41 each comprise a first slit portion 42a that is formed in the bottom 41 between a peripheral wall 43 surrounding the HDD 26 and the contact portion of the leg portion 51, and extends substantially parallel to the peripheral wall 43; and two second slit portions 42b that are formed in the bottom 41 parallel to each other and inwardly extend from the opposite ends of the first slit portion 42a away from the peripheral wall 43. The two second slit portions 42b extend outside of the leg portion 51 of the HDD 26 and reaches a position remoter from the peripheral wall 43 than the leg portion 51.

Respective rectangular elastic buffer members 44 are stuck to the inner surfaces of the portions of the bottom 41 surrounded by the U-shaped slits 42. The buffer members 44 extend along the length of the HDD 26. In other words, the first slit portion 42a and second slit portions 42b of each slit 42 extend along the outer edges of the corresponding buffer member 44.

The buffer members 44 are in contact with the bottoms of the leg portions 51 of the HDD 26, with the HDD 26 received in the recess 24. Namely, the buffer members 44 corresponding to the four slits 42 are interposed between the portions of the bottom 41 surrounded by the slits 42 of the recess 24, and the leg portions 51 of the HDD 26.

The HDD 26 is attached to the recess 24 by the attachment fittings 33. The attachment fittings 33 are deformable to absorb the horizontal movement of the HDD 26. To this end, the buffer members 44 kept in contact with the respective leg portions 51 are shaped so that their long sides are parallel to the movement direction (i.e., horizontal movement) of the HDD 26.

Further, since the recess 24 is shaped like a bathtub, the bottom 41 exhibits a higher rigidity as it is closer to the peripheral wall 43 standing from the periphery of the recess 24, and exhibits a lower rigidity as it is closer to the center (i.e., as it is remoter from the peripheral wall 43. Therefore, the bottom 41 formed of plastic material is more deformable as it is away from the peripheral wall 43. In other words, the bottom 41 exhibits the highest rigidity near the peripheral wall 43.

A circular through hole (opening) 45 is formed in the bottom 41 such that it opposes the motor housing 52 of the HDD 26 when the HDD 26 is received in the recess 24. The hole 45 of the bottom 41 is provided to permit the motor housing 52 of the HDD 26 to escape from contact with the bottom 41 when, for example, the note PC 11 falls and receives an external impact. For this reason, the hole 45 of the bottom 41 has a diameter larger than the outer diameter of the motor housing 52.

As shown in FIG. 8, a plurality of ribs 46, which serve as spacers for keeping a gap G between the reverse surface 41a of the bottom 41 of the recess 24 and the inner surface 21a of the main unit cabinet 21 (first wall) as the upper side of the main unit 12, are aligned with the peripheral wall 43. Since the ribs 46 are provided along the peripheral wall 43 between the bottom 41 of the recess 24 and the main unit cabinet 21, they do not overlap with the HDD 26 received in the recess 24.

In the first embodiment, two ribs 46 are formed integral with the reverse surface 41a of the bottom 41 of the recess 24, projecting from the reverse surface 41a at positions away from the slits 42, as is shown in FIG. 9. Three or more ribs 46 may be provided. It is sufficient if the ribs are provided outside a region that overlaps with the HDD 26. Further, the ribs 46 may be formed integral with the inner surface 21a of the main unit cabinet 21 such that it projects from the inner surface 21a, or may be formed as members separate from the inner surface 21a and projecting therefrom.

The gap G kept by the ribs 46 between the bottom 41 of the recess 24 and the main unit cabinet 21 is provided for preventing the inner surface 21a of the main unit cabinet 21 from contacting the bottom 41 when the portions of the bottom 41 surrounded by the U-shaped slits 42 are deformed as described later. By virtue of the ribs 46, the entire recess 24 does not move toward the main unit cabinet 21 even when, for example, the PC 11 falls and receives an external impact.

Further, the gap G, which is formed between the bottom 41 of the recess 24 and the main unit cabinet 21 (not shown in FIG. 9), permits a flexible printed wiring board 56 for connecting a small substrate 55 to a printed circuit board to be received therein as shown in FIG. 9. Namely, the flexible printed wiring board 56 located at this position does not overlap the U-shaped slits 42, and is therefore not interfered with by the bottom 41 even if the bottom is deformed.

Referring to FIGS. 10 and 11, as well as FIG. 8, the operation of the above-mentioned buffer structure 40 will be described. Suppose here that when the note PC is folded to place the display unit 13 on the main unit 12, it falls with the display unit 13 facing downward. The buffer structure 40 functions most efficiently when the note PC 11 falls in this state.

When the note PC 11 falls with the reverse surface of the main unit 12 facing upward as shown in FIG. 8, an impact is propagated from below to the main unit cabinet 21 through the display unit 13, whereby it is directly propagated from the inner surface 21a of the main unit cabinet 21 to the peripheral wall 43 of the recess 24 through the ribs 26. As a result, strong downward force is exerted on the HDD 26 to thereby compressively deform the buffer members 44 and to downwardly incline the portions of the bottom 41 that are each surrounded at three sides by the U-shaped slits 42, as is shown in FIG. 10.

More specifically, when the note PC 11 is in such a state as shown in (a) of FIG. 11, if it falls, the main unit cabinet 21 of the main unit 12 receives a strong impact from below. This impact is propagated from below to the peripheral wall 43 of the recess 24 via the ribs 46, and the HDD 26 moves downward because of the inertia force of falling.

At this time, as shown in (b) of FIG. 11, the buffer members 44 provided between the HDD 26 and the bottom 41 at positions corresponding to the four leg portions 51 are compressed and deformed to thereby absorb the impact (impact absorption of the first stage). After the compressive deformation of the buffer members 44 reaches its limitation, the portions of the bottom 41, which are each surrounded at three sides by the slits 42, sink as shown in (c) of FIG. 11 to thereby further absorb the impact (impact absorption of the second stage). In FIG. 11, for easy understanding, the deformation of the bottom 41 is illustrated as a downward linear motion instead of an actual inclination.

In other words, the shape, width, length of each slit 42, the distance from the peripheral wall 43, the thickness of the bottom 41, the material and thickness of the buffer members 44, etc., are set so that when an external impact is absorbed, firstly the buffer members 44 are elastically deformed and then the bottom 41 is elastically deformed.

As described above, in the buffer structure 40 of the first embodiment, when an external impact is exerted on the note PC 11 in the above-mentioned direction, at the first stage, the buffer members 44 are compressively deformed to absorb the impact, and at the second stage, the portions of the bottom 41 surrounded by the U-shaped slits 42 are elastically deformed to further absorb the impact, whereby little vibration is exerted on the HDD 26.

In contrast, in, for example, the conventional buffer structure shown in FIG. 12 (that has no slits 42 in the bottom 41), when an external impact is exerted on the note PC 11, only the buffer members 44 are compressively deformed to absorb the impact and the bottom 41 of the recess 24 is little deformed, as is shown in (b) of FIG. 12. As a result, the impact cannot sufficiently be absorbed.

In particular, in the first embodiment, since the ribs 46 for propagating impact are opposed to the peripheral wall 43 of the recess 24, the impact can be concentrated onto the portions of the recess 24 that have the highest rigidity, whereby little impact is directly propagated to the HDD 26. Further, in this case, since each slit 42 has the first slit portion 42a located between the leg portion 51 and the peripheral wall 43, the impact propagated to the leg portion 51 through the peripheral wall 43 can be interrupted. Thus, the external impact can be further effectively absorbed.

Also, since in the first embodiment, the ribs 46 that propagate the impact from the main unit cabinet 21 to the recess 24 are located away from the leg portions 51 of the HDD 26, the impact can be sufficiently attenuated during its propagation from the ribs 46 to the leg portions 51, thereby enhancing the buffer performance.

Further, in the first embodiment, since the ribs 46 are interposed between the bottom 41 of the recess 24 and the main unit cabinet 21 to secure the gap G therebetween, the bottom 41 and the main unit cabinet 21 are prevented from contacting each other even when the portions of the bottom 41 inside the slits 42 are deformed and positioned closer to the main unit cabinet 21. As a result, such a disadvantage as propagation of undesired vibration to the HDD 26 via the deformed bottom 41 can be avoided.

Furthermore, in the first embodiment, since the hole 45 is formed in the bottom 41 of the recess 24 for permitting the motor housing 52 projecting the reverse surface 26a of the HDD 26 to escape therethrough, the bottom 41 and the HDD 26 are prevented from contacting each other even when the buffer members 44 are crashed and the portions of the bottom 41 inside the slits 42 are deformed and positioned closer to the HDD 26. As a result, such a disadvantage as propagation of undesired vibration to the HDD 26 by the contact can be avoided. In particular, in the first embodiment, to prevent the above-mentioned contact of members, no projections are provided on the inner surface 41b (see FIG. 6) of the bottom 41 of the recess 24.

Buffer structures according to other embodiments, in particular, slits according to other embodiments will now be described. In the embodiments described below, elements similar to those of the first embodiment are denoted by corresponding reference numbers, and no detailed description will be given thereof. Namely, only different portions will be described in detail.

FIG. 13 shows a slit 61 incorporated in a buffer structure according to a second embodiment. The slit 61 is formed in the portion of the bottom 41 located between the leg portions 51 and the peripheral wall 43 of the recess 24, and extends linearly along and over the entire length of the respective buffer members 44. The slit 61 is formed at a position at which the impact directly propagated to the peripheral wall 43 through the ribs 46 can be most effectively prevented from being propagated to the leg portions 51. Also, since the slit 61 does not include the two slit portions 42b that are incorporated in each slit 42 of the first embodiment and extend away from the peripheral wall 43, it has a simpler shape than each slit 42.

FIG. 14 shows two slits 62a and 62b formed in a buffer structure according to a third embodiment. The buffer structure of the third embodiment incorporates the slit 62a formed at the same position as the slit 61 of the second embodiment, and the slit 62b extending parallel to the slit 62a at a position away from the peripheral wall 43, with the leg portion 51 interposed therebetween. Accordingly, this buffer structure is more deformable than that of the second embodiment.

FIG. 15 shows an L-shaped slit 63 incorporated in a buffer structure according to a fourth embodiment. The slit 63 extends along and over the buffer member 44 and is provided at a corner of the bottom 41 of the recess 24. To enable the slit 63 to effectively absorb the impact propagated from the peripheral wall 43, it is formed in the portion of the bottom 41 between the peripheral wall 43 and the leg portion 51.

FIG. 16 shows a U-shaped slit 64 incorporated in a buffer structure according to a fifth embodiment. The slit 64 has a shape obtained by rotating the slit 42 of the first embodiment through 90 degrees, or by coupling the opposite ends of the two slits 62a and 62b of the third embodiment.

FIG. 17 shows an arcuate slit 65 incorporated in a buffer structure according to a sixth embodiment. FIG. 18 shows a slit 66 of a trapezoidal shape without a bottom incorporated in a buffer structure according to a seventh embodiment. The shape of the slit is not limited to the above. It is sufficient if at least part of a slit extends between the leg portion 51 and the peripheral wall 43.

FIG. 19 shows a slit 67 according to a first modification of the slit 42 of the first embodiment. The slit 67 has opposite ends formed arcuate. FIG. 20 shows a slit 68 according to a second modification. The slit 68 has opposite ends formed circular. FIG. 21 shows a slit 69 according to a third modification. The slit 69 has opposite ends bent outwardly substantially at right angles. FIG. 22 shows a slit 70 according to a fourth modification. The slit 70 has opposite ends bent inwardly substantially at right angles.

According to an electronic device of at least one of the embodiments described above, the buffer structure can effectively absorb the external impact exerted on the hard disk drive.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For instance, although in the above-described embodiments, the four slits corresponding to the four leg portions 51 of the HDD 26 are formed in the bottom 41 of the recess 24, the invention is not limited to this. The number of leg portions 51 and the number of slits can be set arbitrarily.

What is claimed is:

1. An electronic device comprising:
a hard disk drive comprising a first surface, a second surface opposite to the first surface, a plurality of first projections projecting from the second surface along a periphery of the second surface, and a second projection projecting from the second surface and having a height less than a height of the plurality of first projections;
a casing comprising a first wall, a second wall opposite to the first wall, the second wall including a support portion and a recess formed in the second wall to receive the hard disk drive, the recess including a bottom supporting the first projections and a peripheral wall surrounding the hard disk drive; and
a cover member attached to the second wall of the casing and having at least a portion opposing the first surface of the hard disk drive,
wherein the recess includes a plurality of first slits formed in the bottom closer to the peripheral wall than the first projections.

2. The electronic device of claim 1, wherein the bottom includes a plurality of second slits that extend from opposite ends of each of the plurality of first slits and reach positions farther from the peripheral wall than the first projections, wherein the plurality of second slits extend along outer peripheries of the first projections.

3. The electronic device of claim 2, further comprising a spacer provided in the casing between the bottom and the first wall along the peripheral wall such that the spacer does not overlap with the hard disk drive.

4. The electronic device of claim 3, further comprising elastic buffer members provided between the bottom and the respective first projections, the first and second slits extending along outer peripheries of the buffer members.

5. The electronic device of claim 4, wherein the buffer members extend along a length of the hard disk drive.

6. The electronic device of claim 2, wherein the second projection is positioned at a position corresponding to a motor of the hard disk drive, and wherein the bottom includes an opening larger than a perimeter of the second projection and positioned at a position corresponding to the second projection.

7. The electronic device of claim 1, wherein the recess includes a plurality of third slits, and wherein the plurality of first projections are interposed between the plurality of third slits and the plurality of first slits.

8. The electronic device of claim 1, wherein the peripheral wall includes a corner, and wherein the plurality of first slits are positioned between the corner and at least some of the plurality of first projections.

* * * * *